United States Patent [19]

Morton

[11] Patent Number: 6,064,573
[45] Date of Patent: May 16, 2000

[54] METHOD AND APPARATUS FOR EFFICIENT CONDUCTION COOLING OF SURFACE-MOUNTED INTEGRATED CIRCUITS

[75] Inventor: James R. Morton, Valencia, Calif.

[73] Assignee: Litton Systems, Inc., Woodland Hills, Calif.

[21] Appl. No.: 09/127,436

[22] Filed: Jul. 31, 1998

[51] Int. Cl.[7] .................................................. H05K 7/20
[52] U.S. Cl. ........................ 361/704; 165/185; 174/16.3; 257/713; 361/710; 361/715; 361/717
[58] Field of Search ................................. 165/80.2, 80.3, 165/185; 174/16.3; 257/706–708, 712–713, 718–719; 361/704, 707, 709–722; 439/485, 487

[56] References Cited

U.S. PATENT DOCUMENTS 5,548,482  8/1996  Hatauchi et al. ........................ 361/720

OTHER PUBLICATIONS

Metreaud, IBM Tech Disl. Bul. "Air–Cooled Semiconductor Chip Module Configuration", vol. 20, No. 7, pp. 2697–2698, Dec. 1977.

Metreaud et al, IBM Tech. Disl. Bul. "Air–Cooled Semiconductor Chip Module Configuration", vol. 20, No. 7, pp. 2695–2696, Dec. 1977.

Brochure entitled "CIN::APSE™ High Density Interconnect Technology" bearing an identification "10M894 CA–10"; published by Cinch, a Division of Labinal Components & Systems, Inc. No Known Date.

*Primary Examiner*—Gregory Thompson
*Attorney, Agent, or Firm*—Lewis B. Sternfels

[57] ABSTRACT

A plurality of heat-conducting compressible button contacts (10) between a heatsink (28) and an electronic part, e.g., a printed wiring board (22) or integrated circuit (24), to be cooled. A thin plate (16) and/or indentations (44, 44') in the heatsink are preferably used to support the heat-conducting buttons. Each heat-conducting button contact is placed in compression, generally, for example, by the heatsink. A thermal path is thus provided between the part and the heatsink. Differently sized compressible button contacts are used to accommodate disparate heights between the heat sink and surfaces on components of the electronic part.

12 Claims, 2 Drawing Sheets

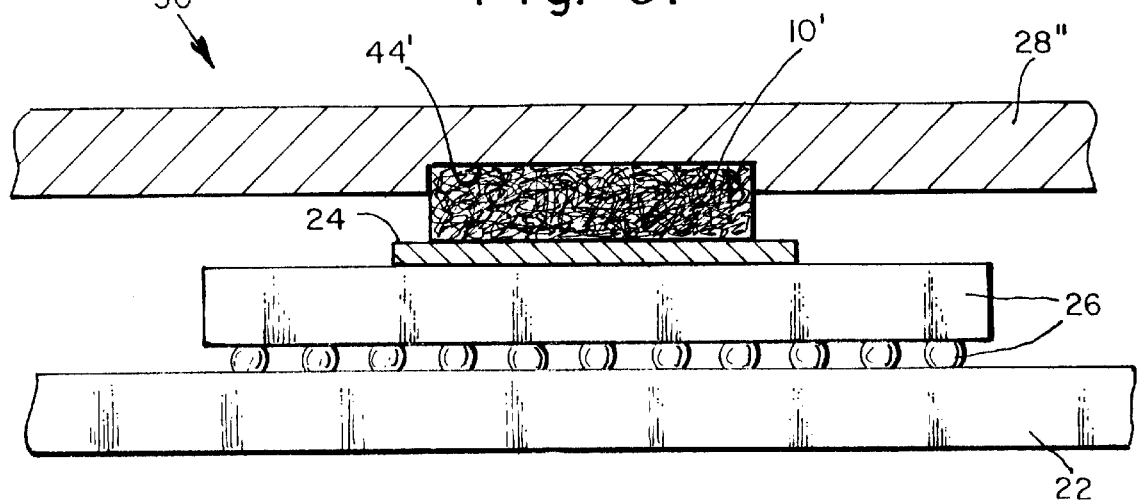
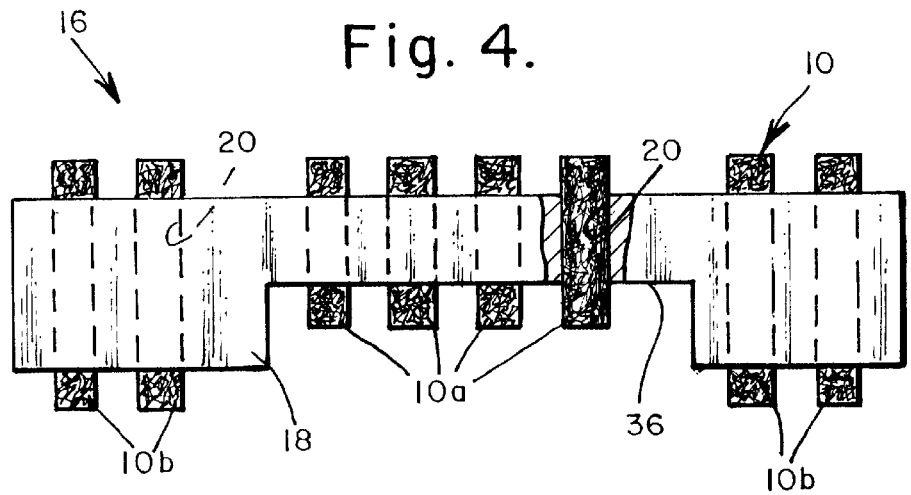

METHOD AND APPARATUS FOR EFFICIENT CONDUCTION COOLING OF SURFACE-MOUNTED INTEGRATED CIRCUITS

CROSS-REFERENCE TO RELATED APPLICATION

Not Applicable

REFERENCE REGARDING FEDERAL SPONSORSHIP

Not Applicable

REFERENCE TO MICROFICHE APPENDIX

Not Applicable

BACKGROUND OF THE INVENTION

1. Field of the Invention

The present invention relates to a method and apparatus for efficient conduction cooling of surface-mounted electronics and, in particular, to improvements in such a method and apparatus utilizing heat-conducting compressible button contacts in thermal contact between a heat sink and one or more surface-mounted electronic devices, including those that are not equally distanced from the heat sink.

2. Description of Related Art and Other Considerations

High power (e.g., greater than two watts) surface mounted parts are not generally used in military systems. When used, however, heat energy is conducted through thermal vias underneath each part. Ball-grid-arrays and PQFPs are usually cooled by attaching a large finned heat-sink or aluminum plate to the top of the component. It is difficult to effectively remove heat from these components at extended temperatures encountered in military systems as heat is removed from components from the bottom of the component. Ball grid array parts with exposed bare dies have used a top mounted finned heatsink or plate. Component height variations create one or more thermal gaps in this arrangement, which gaps must be compensated for by utilizing some adjustable mechanism. In one adjustable mechanism, the heatsink plates employ a threaded thermal slug which must be adjusted for each part.

Disadvantages exist in such arrangements, which add time and other costs. Each electronic part requiring a heat sink must be individually adjusted. The heatsink plate must be sufficiently thick to support a threaded slug.

SUMMARY OF THE INVENTION

These and other problems are successfully addressed and overcome by the present invention. A plurality of heat-conducting compressible button contacts are in thermal contact between a heatsink and an electronic part, e.g., a printed wiring board or integrated circuit, to be cooled. A thin plate and/or indentations in the heatsink are preferably used to support the heat-conducting buttons. Each heat-conducting button contact is placed in compression, generally for example, by the heatsink. A thermal path is thus provided between the part and the heatsink. The buttons are individually sized and paired with components of different heights to accommodate the varying distances between the components and the heat sink.

Several advantages are derived from this arrangement. The invention allows removing heat to be removed from the top of surface mount components as well as from the bottom. It simplifies module assembly, in that no individual adjustments are required. It provides a mechanically compliant thermal path between components of varying heights and a top mounted heatsink.

Surface mounted parts on printed wiring boards are effectively cooled. The tops of the components, such as when positioned on a printed wiring board, are thermally coupled in an efficient manner to a top mounted heatsink plate. A high thermal conductivity path is maintained from the top of each part even when the components are subjected to vibration. The thermal paths are not deleteriously affected due to variations in the heights of differently sized components or of similar components whose heights differ from irregularities in manufacturing and assembly tolerances. Assembly and disassembly of the printed wiring board and the heatsink is easily obtainable.

Other aims and advantages, as well as a more complete understanding of the present invention, will appear from the following explanation of exemplary embodiments and the accompanying drawings thereof.

BRIEF DESCRIPTION OF THE DRAWINGS

FIG. 4 is a cross-sectional view of the plate shown in FIG. 3;

FIG. 6 is a view of a third embodiment of the present invention utilizing a heatsink with an indentation for supporting one or more of the large button contacts illustrated in FIG. 1 along their short axes.

DETAILED DESCRIPTION OF THE PREFERRED EMBODIMENTS

Figure 1:
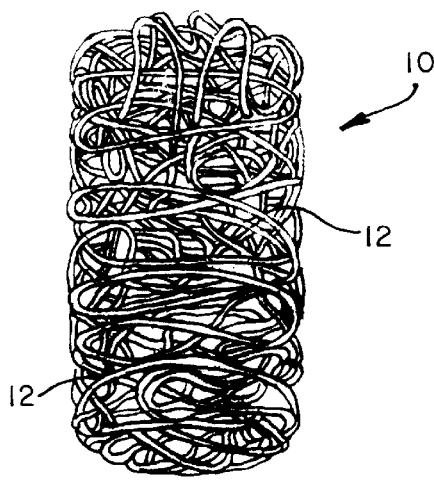
FIG. 1 is a view of a preferred heat-conducting compressible button contact used in the present invention.

As depicted in FIG. 1, a thermally conductive compressible button contact 10 comprises one or more randomly wound wires or filaments 12 formed into a specific height and diameter, ranging from 0.020" in diameter by 0.032" in height and upwards. As such, it has the appearance of a beam-like pillar. Such a button is produced by Cinch, a Division of Labinal Components & Systems, Inc., and described in their brochure entitled "CIN::APSE™ High Density Interconnect Technology" bearing an identification "10M894 CA-10" which describes its button contact as "constructed of randomly wound molybdenum wire which is formed into a specific height and diameter. Standard CIN::APSE contact diameters are 0.020" and 0.040"." It is used as an electrical contact in various electrical applications. A copy of the brochure is enclosed as part of the application file. Its use in the present invention is as a conductor of thermal, rather than of electrical, energy.

Figure 3:
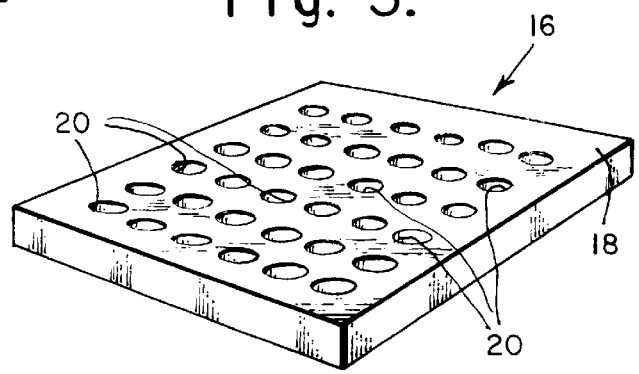
FIG. 3 is a view of a thin plate used in the FIG. 2 embodiment to support a plurality of contacts shown in FIG. 1.
Figure 2:
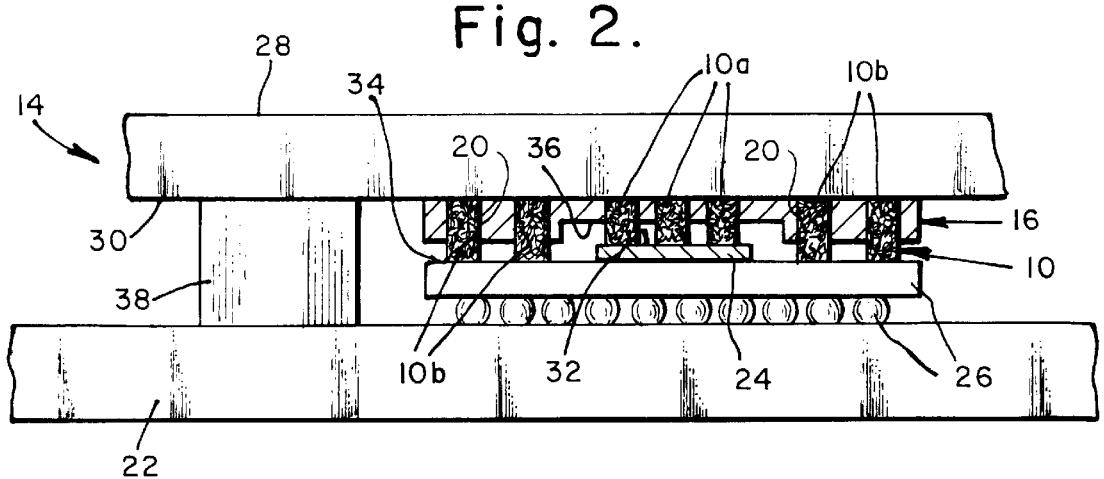
FIG. 2 is a view of a first embodiment of the present invention.

In one embodiment of the present invention, an assembly 14 as illustrated in FIG. 2 includes a plurality of contacts 10 supported in a support 16. As best shown in FIGS. 3 and 4, support 16 comprises a plate 18 which is provided with holes 20. Each contact 10 is held within its hole 20. Before being placed in assembly 14, contacts 10 extend from the upper and lower surfaces of plate 18, as illustrated in FIG. 4, in readiness to be compressed. In this embodiment, a printed wiring board 22 supports an electronic die 24, such as by a ball grid array package 26. A heat sink 28, having a lower surface 30, is positioned above grid array package 26 and electronic die 24. The heat sink may be composed of any suitable material having good heat conducting characteristics such as of copper, aluminum or a carbon composite. Both the ball grid array package and the electronic die are thermally coupled to heat sink 28 by a plurality of thermal buttons 10 which are supported within support 16. In particular, because electronic die 24 is positioned on ball grid array package 26, their respective upper surfaces 32 and 34 are at different heights and, therefore, disparate distances from facing surface 30 of heat sink 28. To accommodate these heights, button contacts 10 are grouped as sets 10a and 10b having different heights, with set 10a extending between surfaces 32 and 30 and set 10b extending between surfaces 34 and 30. In addition, to accommodate die 24, support 16 may be provided with a recess 36. When assembly 14 is constructed, thermal button contacts 10 are compressed from that shown in FIG. 4 to ensure that good thermal contact is made. However, to limit compression, one or more spacers 38 may be placed between heat sink 28 and printed wiring board 22.

Figure 5:
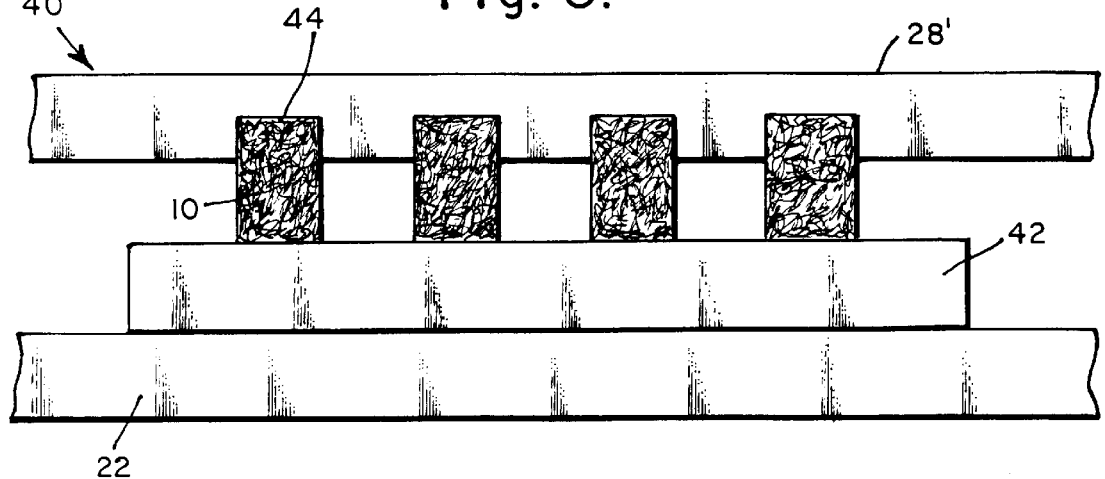
FIG. 5 is a view of a second embodiment of the present invention utilizing a heatsink with indentations for supporting a plurality of contacts illustrated in FIG. 1 along their long axes.

An alternate arrangement to that depicted in FIG. 2 is shown in FIG. 5. Here, an assembly 40 comprises an integrated circuit 42 mounted on the surface of printed wiring beard 22 and thermally coupled to a heat sink 28' by a plurality of thermally conductive button contacts 10. In this embodiment, support 16 of FIG. 2 is replaced by a plurality of recesses 44 in heat sink 28'. Otherwise, this embodiment is the same as that described with respect to assembly 14 of FIG. 2. Spacers, such as spacer 38 of FIG. 2, may be employed with assembly 40 to prevent overcompression of contacts 10.

A further embodiment is disclosed in FIG. 6 comprising an assembly 50 in which an electronic die 24 is surface mounted on printed wiring board 22 by a ball grid array package 26 and thermally coupled to a heat sink 28" by a single thermally conductive compressible button contact 10'. In this embodiment, heat sink 28" includes a recess 44' and contact 10' resides on its side for retention therein.

Although the invention has been described with respect to particular embodiments thereof, it should be realized that various changes and modifications may be made therein without departing from the spirit and scope of the invention.

What is claimed is:

1. Apparatus for efficient conduction cooling of surface-mounted integrated circuits comprising:
    electronics;
    a heat sink;
    means defining at least one thermally conductive compressible button contact thermally coupling said electronics to said heat sink, said contact comprising randomly wound filaments having resilience memory; and
    a support for supporting said thermally conductive button contact means between said heat sink and said electronics.

2. Apparatus according to claim 1 in which said button contact comprises a beam-like pillar.

3. Apparatus according to claim 2 in which said electronics include electronic components having surfaces positioned at different heights and said heat sink has at least one generally level surface to provide disparate distances between said heat sink and said electronic component surfaces, and further including a plurality of said thermally conductive buttons disposed between said heat sink and said electronic component surfaces and compressible therebetween to enable thermal contact between said disparately distant surfaces.

4. Apparatus for efficient conduction cooling of surface-mounted integrated circuits comprising:
    electronics including electronic components having surfaces positioned at different heights;
    a heat sink having at least one generally level surface to provide disparate distances between said heat sink and said electronic component surfaces;
    a plurality of thermally conductive buttons disposed between said heat sink and said electronic component surfaces and compressible therebetween to enable thermal contact between said disparately distant surfaces for thermally coupling said electronics to said heat sink, each of said contact buttons comprising a beam-like pillar of randomly wound filaments having resilience memory; and
    a support for supporting said plurality of said thermally conductive buttons between said heat sink and said electronic components.

5. Apparatus according to claim 4 in which said electronic components comprise:
    a printed wiring board;
    a heat producing die terminating at one of said component surfaces; and
    a ball grid array package terminating at a second of said component surfaces and coupling said die to said printed wiring board.

6. Apparatus according to claim 5 in which said support includes a first portion for supporting said thermally conductive buttons coupled to said ball grid array package and a second portion for supporting said thermally conductive buttons coupled to said heat producing die, said second portion having a recess for accommodating said heat producing die.

7. Apparatus according to claim 6 further comprising a spacer disposed between said heat sink and said printed wiring board for limiting compression of said compressible button contacts.

8. Apparatus according to claim 5 in which said heat sink is provided with recessed portions for reception and support of said thermally conductive buttons.

9. Apparatus according to claim 1 in which said heat sink is provided with a recess and said button contact comprises a beam-like pillar having long and short axes, said button contact being laid along its longer axis within the recess.

10. Apparatus for efficient conduction cooling of surface-mounted integrated circuits comprising:
    electronic components having surfaces positioned at different heights;
    a heat sink having at least one generally level surface to provide disparate distances between said heat sink and said electronic component surfaces;
    a plurality of thermally conductive compressible button contacts comprising randomly wound filaments having resilience memory disposed between said heat sink and said electronic component surfaces and compressible therebetween to enable thermal coupling between said disparately distant surfaces and thus to thermally couple said electronic components to said heat sink; and
    a support for supporting said plurality of said thermally conductive button contacts between said heat sink and said electronic components.

11. A method for efficient conduction cooling of electronics coupled to a heat sink, comprising the steps of:

utilizing at least one thermally conductive compressible button contact means comprising randomly wound filaments having resilience memory;

thermally coupling the electronics to the heat sink by the thermally conductive compressible button means; and supporting said thermally conductive button contact means by a supporting means between the heat sink and the electronic components.

12. A method according to claim 11 in which the heat sink has at least one generally level surface and the electronics include electronic components having surfaces positioned at different heights with respect to the heat sink surface to provide disparate distances between the heat sink and the electronic component surfaces, further including the steps of:

utilizing a plurality of differently sized thermally conductive button means;

pairing the differently sized thermally conductive button means with the electronic components consistent with the disparate distances; and disposing the differently sized thermally conductive button means between the heat sink and the paired electronic component surfaces to equalize the different heights and to facilitate thermal contact between all of the disparately distant surfaces and the heat sink.

\* \* \* \* \*